United States Patent
Nogawa

(10) Patent No.: US 6,786,392 B2
(45) Date of Patent: Sep. 7, 2004

(54) WIRE BONDING DEVICE AND WIRE BONDING METHOD

(75) Inventor: Jun Nogawa, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/277,515

(22) Filed: Oct. 22, 2002

(65) Prior Publication Data

US 2003/0098333 A1 May 29, 2003

(30) Foreign Application Priority Data

Nov. 27, 2001 (JP) .......................... 2001-360892

(51) Int. Cl.⁷ .................... B23K 1/06; B23K 20/10
(52) U.S. Cl. .................. 228/180.5; 228/110.1; 228/1.1; 228/45
(58) Field of Search ............ 228/180.5, 110.1, 228/1.1, 45

(56) References Cited

U.S. PATENT DOCUMENTS

| | | | | |
|---|---|---|---|---|
| 5,169,050 A | * | 12/1992 | Montagu | 228/4.5 |
| 5,897,049 A | * | 4/1999 | Nakamura et al. | 228/180.5 |
| 6,439,448 B1 | * | 8/2002 | Ringler | 228/110.1 |

FOREIGN PATENT DOCUMENTS

| | | | | |
|---|---|---|---|---|
| JP | 57-155739 | 9/1982 | .......... | H01L/21/60 |
| JP | 61-234044 | 10/1986 | .......... | H01L/21/60 |
| JP | 03-268437 | 11/1991 | .......... | H01L/21/60 |
| JP | 06029343 A | * | 2/1994 | |
| JP | 06-029343 | 2/1994 | .......... | H01L/21/60 |
| JP | 10-041331 | 2/1998 | .......... | H01L/21/60 |

* cited by examiner

Primary Examiner—Kevin L. McHenry
(74) Attorney, Agent, or Firm—Hayes Soloway P.C.

(57) ABSTRACT

An object is to reduce impact load applied on a bonding subject at the time of wire contact detection and achieve a stable and highly precise fabrication of a bonding ball so as to shorten the bonding time. A wire bonding arm comprises: a Z driving shaft supported by a Z-axis base capable of swinging via a first shaft; and a low pressurizing shaft with a smaller inertia than that of the Z driving shaft having a capillary, which is supported on one end of the Z driving shaft to be capable of swinging via a second shaft. The capillary is brought down by the Z driving shaft to the position of the height right before an initial ball comes to contact with a first bonding point. Then, only the low pressurizing shaft is driven at low speed to be brought down while holding the Z driving shaft in position. At the point where the initial ball comes in contact with the first bonding point, a prescribed weight and ultrasonic vibrations are applied for bonding it to the first bonding point.

7 Claims, 5 Drawing Sheets

WIRE BONDING DEVICE AND WIRE BONDING METHOD

BACKGROUND OF THE INVENTION

1. Field of the Invention

The present invention relates to a wire bonding device and a wire bonding method in which the impact load applied on a bonding subject at the time of wire contact detection can be reduced and a highly precise and stable bonding can be achieved by a minute bonding ball diameter while enabling to achieve a high productivity through high-speed bonding.

2. Description of the Related Art

Conventionally, it has been required for a wire bonding device to have a structure in which bonding arms are extended in order to avoid interference between the conveyor/fixing mechanism of the bonding subject. It is to satisfy the needs for expanding the field of bonding aiming at large-scaled bonding subjects and improving productivity. On the other hand, in order to cope with the narrowing intervals of the wire bonding portion of the bonding subject, it has been desired that the shape of the bonding portion be made minute with high precision.

FIG. 5 shows a schematic model block diagram of an example of the wire bonding device of the related art.

A wire bonding device of the related art comprises: a Z-axis base 101 mounted on an XY table (not shown) having a unit which drives in the X and Y directions crossing orthogonal to each other; a bonding arm 103 supported by the Z-axis base 101 via a shaft 102 to be capable of swinging; and a VCM (voice coil motor) 104 for driving the bonding arm 103 in the Z-axis direction. Provided in the bonding arm 103 are an ultrasonic horn 109 having a capillary 108 to which a wire 111 made of a gold wire is inserted and a cut clump 110 for cutting the wire 111. The bonding arm 103 has the length long enough to avoid the interference with the conveyor/fixing mechanism of the semiconductor integrated circuit (not shown) as the bonding subject.

An outline of wire bonding performed by the above-described wire bonding device of the related art will be described below.

First, after forming an initial ball in the tip of the wire 111 extended from the bottom end of the capillary 108, the bonding arm 103 is brought down by the VCM 104 until it comes to be in contact with a first bonding point of the semiconductor integrated circuit. At the time of contact detection when the initial ball comes to be in contact with the semiconductor integrated circuit, the bonding arm 103 is driven at low speed in order to reduce impact load applied on the semiconductor integrated circuit. Subsequently, ultrasonic vibrations generated by an ultrasonic oscillator (not shown) is transmitted to the initial ball via the ultrasonic horn 109 and the capillary 108 while applying a prescribed weight thereto so as to bond the wire 111 to the first bonding point.

After completing bonding at the first bonding point, the capillary 108 is brought up through driving the bonding arm 103 by the VCM 104.

Then, the XY table is moved horizontally to the position over a second bonding point and the wire 111 is pressed to be bonded to the second bonding point in the same manner as that in the first bonding point. Subsequently, the bonding arm 103 is brought up and the wire 111 above the capillary 108 is tightly held by the cut clamp 110 and pulled up. Thereby, the wire 111 is cut at the joint of the second bonding point.

Through the steps as described, wire bonding is performed in the first bonding point and the second bonding point.

However, in the case of using the above-described wire bonding device of the related art, it is likely that the inertia of the bonding arm is increased due to extension of the bonding arm. Thus, the shape and the state of bonding become unstable because of impact load applied at the time of contact detection of the wire to the bonding subject, which may result in deteriorating the bondability. In other words, if the inertia of the bonding arm increases, the impact load applied at the time of the contact detection of the wire to the bonding subject increases, which leads to unstable shape and state of the bonding ball in the first bonding point and unstable crushed shape of the wire and the state in the second bonding point. Thus, there may be a case where the bondability is deteriorated.

Furthermore, it is necessary to reduce the impact load by reducing the dropping speed at the time of contact detection in order to obtain a minute and highly precise bonding shape. Thereby, the productivity is to be deteriorated.

SUMMARY OF THE INVENTION

An object of the present invention is to provide a wire bonding device and a wire bonding method in which the impact load applied at the time of contact detection of the wire to the bonding subject can be reduced and a stable and highly precise fabrication of a minute bonding ball can be achieved while enabling to shorten the bonding time.

In order to achieve above mentioned object, a wire bonding device according to present invention for performing wire bonding on a bonding subject by bringing a wire, which is being lead out from a capillary provided in the end portion of an arm supported to be capable of swinging to be in contact with the bonding subject, wherein the arm comprises: a first arm supported by a first shaft to be capable of swinging; and a second arm with a smaller inertia than the first arm having the capillary in its end portion, which is supported to be capable of swinging by a second shaft provided on one end of the first arm.

In the above-described bonding device of the present invention, a second arm having a capillary is supported to be capable of swinging on one end of the first arm supported to be capable of swinging. The inertia of the second arm is smaller than the inertia of the first arm. Therefore, by performing bonding through driving only the second arm at the time of bringing wire to be in contact with the bonding subject, the impact load applied at the time of the contact detection of the wire to the bonding subject can be reduced. As a result, compared to the case where the inertia of the arm is larger, the speed at the time of the contact detection of the wire to the bonding subject can be increased.

Moreover, the wire bonding device according to present invention, further comprising a first driving unit for swinging the first arm and a second driving unit for swinging the second arm.

A wire bonding method according to present invention for performing wire bonding by bringing a wire, which is being lead out from a capillary, to be in contact with a bonding subject by using a wire bonding device comprising an arm having: a first arm supported by a first shaft to be capable of swinging; and a second arm with a smaller inertia than the first arm having the capillary in its end portion, which is supported to be capable of swinging by a second shaft provided on one end of the first arm, the method comprising the steps of: bringing the capillary near the bonding subject by swinging the first arm in the approaching direction which is the direction of the capillary approaching the bonding subject until the wire reaches a prescribed height which is a position right before coming into a contact with the bonding subject; moving the capillary positioned in the height right before the contact by swinging the second arm in the approaching direction so that the wire is moved from the height right before the contact to be in contact with the bonding subject; and pressing the wire being in contact with the bonding subject against the bonding subject by swinging the second arm in the approaching direction in pressing step.

In the above-described wire bonding method of the present invention, the capillary is brought near the bonding subject by swinging the first arm until reaching the height right before coming to be in contact with the bonding subject. Contacting of the wire to the bonding subject and pressurizing of the wire are performed by the second arm with the smaller inertia than that of the first arm. Thus, the impact load applied at the time of contact detection of the wire to the bonding subject can be reduced. Also, compared to the case where the inertia of the arm is larger, the speed at the time of the contact detection of the wire to the bonding subject can be increased.

Moreover, the wire bonding method according to present invention, wherein the wire is bonded to the bonding subject by applying ultrasonic vibrations to the wire in the pressing step.

Furthermore, the wire bonding method according to present invention, further comprising the steps of: after completing the bonding of the wire to the bonding subject, bringing the capillary back to the height right before the contact by swinging the second arm in the direction where the capillary recedes from the bonding subject.

DETAILED DESCRIPTION OF THE PREFERRED EMBODIMENTS

Now, an embodiment of the present invention will be described by referring to the accompanying drawings.

Figure 1:
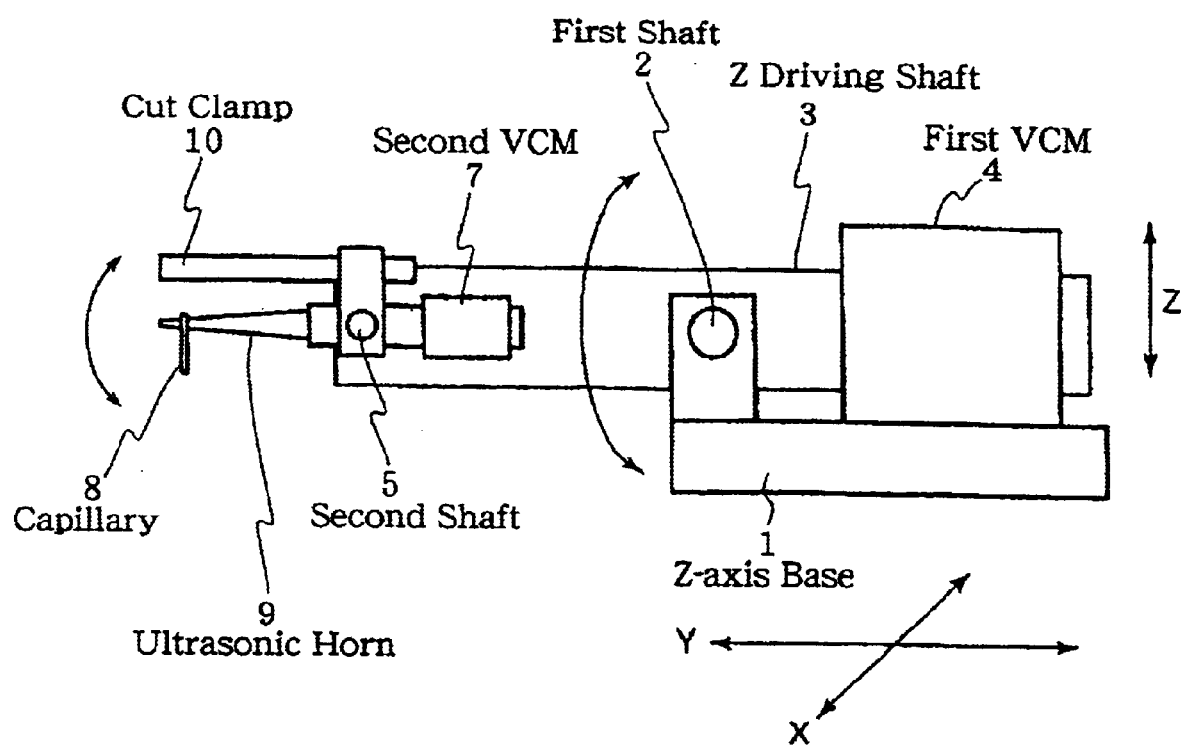
FIG. 1 is a schematic model block diagram of an example of a wire bonding device of the present invention.

FIG. 1 shows a schematic model block diagram of an example of a wire bonding device according to an embodiment.

The wire bonding device according to the embodiment comprises: a Z-axis base 1 mounted on an XY table (not shown) having a unit which drives in the X and Y directions crossing orthogonal to each other; a Z driving shaft 3 supported by the Z-axis base 1 via a first shaft 2 to be capable of swinging; a first VCM 4 for driving the Z driving shaft 3 in the Z-axis direction; a low pressurizing shaft 6 supported on one end of the Z driving shaft 3 to be capable of swinging via a second shaft 5; and a second VCM 7 for swinging the low pressurizing shaft 6 against the Z driving shaft 3 in the Z-axis direction. Further, the low pressurizing shaft 6 comprises an ultrasonic horn 9 with a capillary 8 to which a wire made of a gold wire is inserted and a cut clump 10 for cutting the wire. The low pressurizing shaft 6 has a smaller inertia compared to that of the Z driving shaft 3. In other words, the bonding arm of the wire bonding device according to the embodiment is formed of the Z driving shaft 3, and the low pressurizing shaft 6 with a smaller inertia than that of the Z driving shaft 3, which is supported on one end of the Z driving shaft 3 to be capable of swinging.

Figure 2:
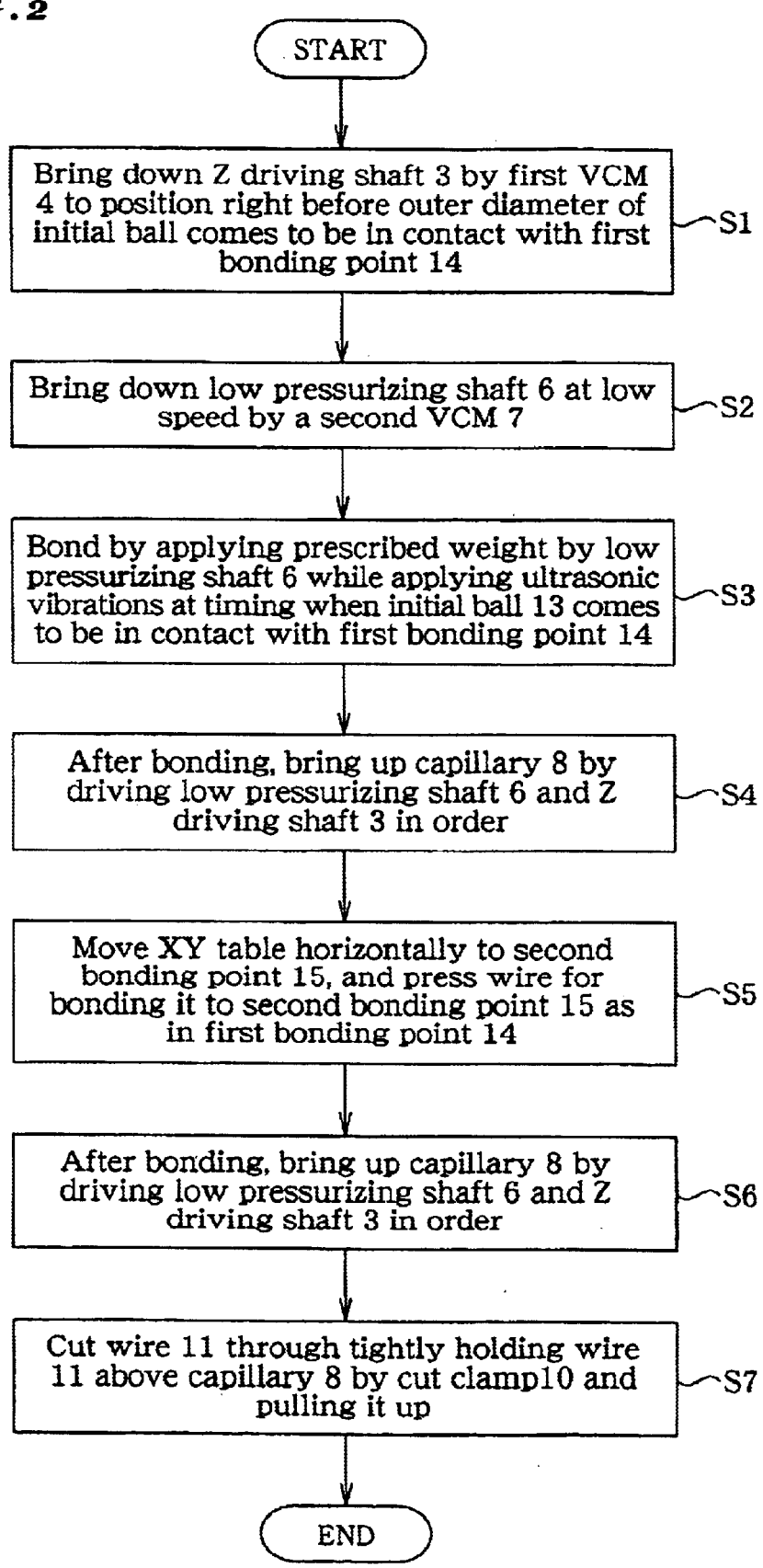
FIG. 2 is a flowchart of wire bonding performed by a wire bonding device of the present invention.
Figure 3:
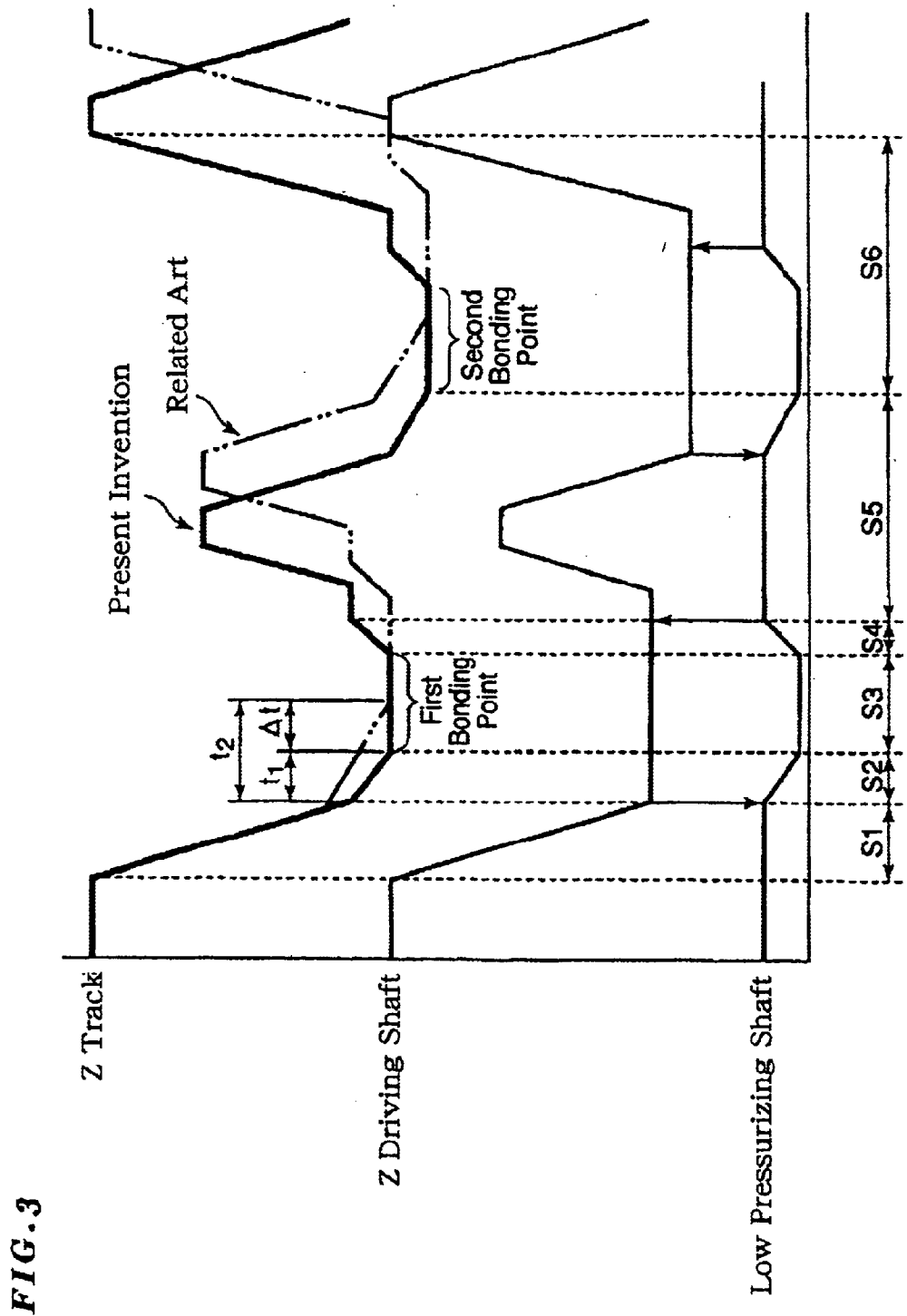
FIG. 3 is a graph showing tracks of Z driving shaft and a low pressurizing shaft, and a track of Z track of a capillary in wire bonding performed by the wire bonding device of the present invention.
Figure 4A:
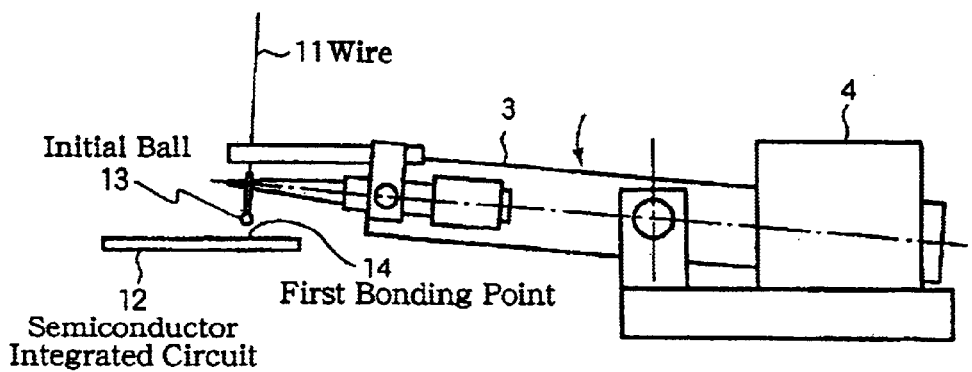
FIGS. 4A–4C are schematic illustrations showing swing of the low pressurizing shaft of the wire bonding service shown in FIG. 1.
Figure 4B:
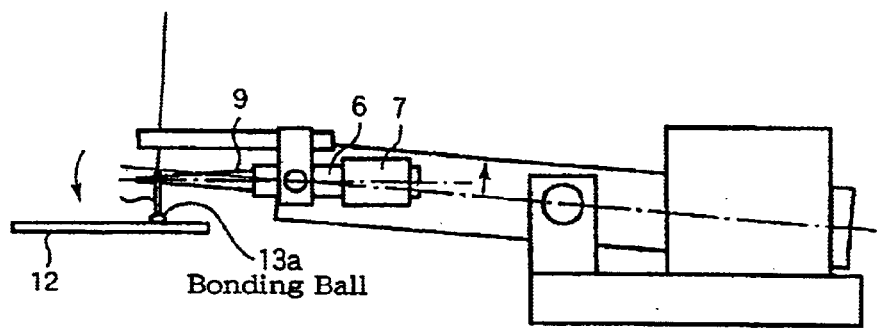
Figure 4C:
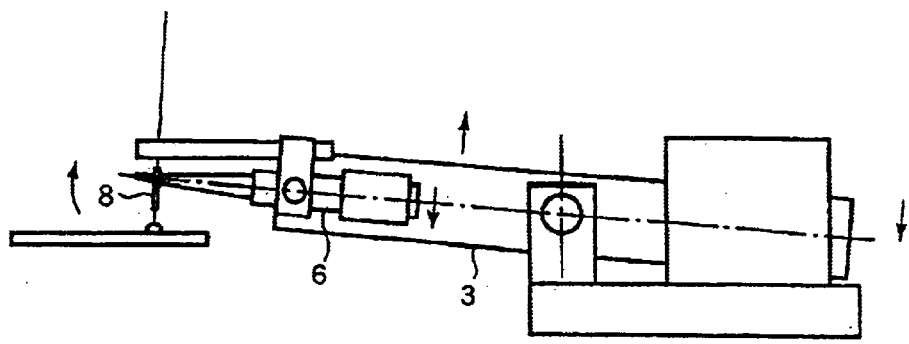
Figure 5:
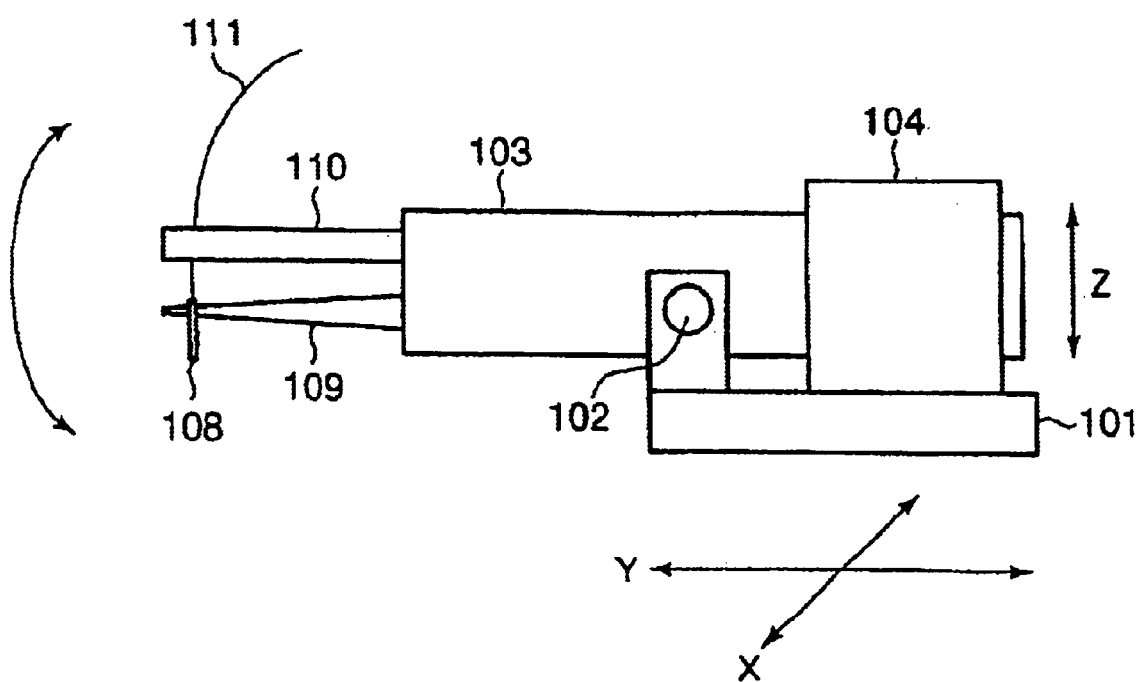
FIG. 5 is a schematic model block diagram of an example of a wire bonding device of the related art.

Next, a wire bonding method using the wire bonding device according to the embodiment will be described by referring to FIG. 2 showing a flowchart of wire bonding according to the embodiment, FIG. 3 which is a graph showing tracks of the Z driving shaft and the low pressurizing shaft and a track of the Z track of the capillary, and FIGS. 4A–4C show schematic illustrations of the wire bonding device showing swing of the low pressurizing shaft. In FIG. 3, the Z track of the tip of the capillary according to the embodiment generated by composing the track of the Z driving shaft and the track of the low pressurizing shaft is shown by a solid line and an example of the Z track of the capillary of the wire bonding device of the related art as a comparison is shown by a double-chained line. Further, S1 to S6 shown in FIG. 6 represent the timing corresponding to steps S1 to S6 shown in the flowchart in FIG. 2.

First, as shown in FIG. 4A, an initial ball 13 is formed in the tip of a wire 11 being lead out from the bottom end of the capillary by discharging electricity to the wire 11 using an electric torch (not shown), and it is brought down, by the Z driving shaft 3 through driving the first VCM 4, to the height which is right before the outer diameter of the initial ball 13 comes to be in contact with a first bonding point 14 of a semiconductor integrated circuit 12 and the Z driving shaft 3 is held at this position (step S1).

Next, as shown in FIG. 4B, the second VCM 7 for swinging and driving the low pressurizing shaft 6 is driven and brought down at low speed (step S2).

Then, at the timing when the contact of the initial ball 13 to the first bonding point 14 is detected by a detecting unit (not shown), ultrasonic vibrations generated by an ultrasonic oscillator is transmitted to a bonding ball 13a via the ultrasonic horn 9 and the capillary 8 while applying a prescribed weight so as to bond the wire 11 to the first bonding point 14 (step S3).

After completing the bonding, as shown in FIG. 4C, the low pressurizing shaft 6 and the Z driving shaft 3 are driven in this order to bring up the capillary 8 (step S4).

Then, the XY table is moved horizontally to the position over a second bonding point (not shown) and the wire is pressed to be bonded to the second bonding point 15 as in the same manner as that in the first bonding point 14 (step S5).

Subsequently, the low pressurizing shaft 6 and the Z driving shaft 3 are brought up in this order (step S6), and the wire is cut at the joint between the second bonding point through tightly holding the wire 11 above the capillary 8 and pulling it up (step S7).

Through the above-described steps, wire bonding is performed in the first bonding point 14 and the second bonding point 15.

As shown in FIG. 3, when bonding an initial ball to the first bonding point, if bonding is performed as in the case of the related art by using only one Z driving shaft in a region requiring a highly precise bonding, it requires time t2. The reason is that it is necessary to reduce the impact load by decreasing the dropping speed at the time of contact detection in order to obtain a minute and highly precise bonding shape. On the contrary, in the embodiment, the initial ball is brought up to the height right before coming to be in contact with the first bonding point 14 by the Z driving shaft 3, and bonding thereafter is performed by the low pressurizing shaft 6 in the region which requires a highly precise bonding, since the low pressurizing shaft 6 has a smaller inertia than that of the Z driving shaft 3 and is capable of highly precise control and reducing the impact load. Thus, it requires time t1, thereby enabling to shorten the time as much as Δt compared to the time t2. The bonding time can be also shortened when bonding is performed in the second bonding point (not shown) as well.

The wire bonding device according to the embodiment may have a configuration having a unit capable of adjusting the fixed position of the Z-axis base 1 against the XY table so that the main axis of the capillary 8 becomes vertical towards the surface of the first bonding point 14 when the low pressurizing shaft 6 is swung downwards in the state in which the Z driving shaft 3 is held at the position where the outer diameter of the initial ball 13 comes to be in contact with the first bonding point 14 of the semiconductor integrated circuit 12 and the tip of the capillary 8 comes to be in contact with the first bonding point 14 of the semiconductor integrated circuit 12.

Furthermore, the embodiment has been described by referring to an example in which the wire bonding device is mounted on the XY table (not shown) having a unit which drives in the X and Y directions crossing orthogonal to each other. However, it may have a configuration having a unit which rotates on an XY plane on the Z-axis base in the θ direction.

In the present invention as described, contacting of the wire to the bonding subject and pressurizing of the wire are performed by the second arm with a smaller inertia than that of the first arm. Thus, the impact load applied at the time of contact detection of the wire to the bonding subject can be reduced so that a stable and highly precise fabrication of a minute bonding ball can be achieved. Furthermore, compared to the case where the inertia of the arm is larger, the speed at the time of the contact detection of the wire to the bonding subject can be increased. Thereby, high productivity can be achieved through high-speed bonding.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2001-360892 (Filed on Nov. 27, 2001) including specification, claims, drawings and summary are incorporated herein by reference in its entirety.

What is claimed is:

1. A wire bonding device for performing wire bonding on a bonding subject by bringing a wire, which is being lead out from a capillary provided in an end portion of an arm supported to be capable of swinging to be in contact with the bonding subject, wherein the arm comprises: a first arm supported by a first shaft to be capable of swinging; and a second arm with a smaller inertia than the first arm having the capillary in its end portion, which is supported to be capable of swinging by a second shaft provided on one end of the first arm.

2. The wire bonding device as claimed in claim 1, further comprising a first driving unit for swinging the first arm and a second driving unit for swinging the second arm.

3. The wire bonding device as claimed in claim 2, wherein the first and second driving units are voice coil motors.

4. A wire bonding method for performing wire bonding by bringing a wire, which is being lead out from a capillary, to be in contact with a bonding subject by using a wire bonding device comprising an arm having: a first arm supported by a first shaft to be capable of swinging; and a second arm with a smaller inertia than the first arm having the capillary in its end portion, which is supported to be capable of swinging by a second shaft provided on one end of the first arm, the method comprising the steps of:

bringing the capillary near the bonding subject by swinging the first arm in the approaching direction which is the direction of the capillary approaching the bonding subject until the wire reaches a prescribed height which is a position right before coming into a contact with the bonding subject;

moving the capillary positioned in the height right before the contact by swinging the second arm in the approaching direction so that the wire is moved from the height right before the contact to be in contact with the bonding subject; and pressing the wire being in contact with the bonding subject against the bonding subject by swinging the second arm in the approaching direction in pressing step.

5. The wire bonding method as claimed in claim 4, wherein the wire is bonded to the bonding subject by applying ultrasonic vibrations to the wire in the pressing step.

6. The wire bonding method as claimed in claim 5, further comprising the steps of: after completing the bonding of the wire to the bonding subject, bringing the capillary back to the height right before the contact by swinging the second arm in the direction where the capillary recedes from the bonding subject.

7. The wire bonding method as claimed in claim 4, further comprising the steps of: after completing the bonding of the wire to the bonding subject, bringing the capillary back to the height right before the contact by swinging the second arm in the direction where the capillary recedes from the bonding subject.

* * * * *